(12) United States Patent
Lincoln et al.

(10) Patent No.: US 7,683,303 B2
(45) Date of Patent: Mar. 23, 2010

(54) NANOSCALE VOLUMETRIC IMAGING DEVICE HAVING AT LEAST ONE MICROSCALE DEVICE FOR ELECTRICALLY COUPLING AT LEAST ONE ADDRESSABLE ARRAY TO A DATA PROCESSING MEANS

(75) Inventors: Patrick Denis Lincoln, Woodside, CA (US); Charles M. Patton, Eugene, OR (US)

(73) Assignee: SRI International, Menlo Park, CA (US)

( * ) Notice: Subject to any disclaimer, the term of this patent is extended or adjusted under 35 U.S.C. 154(b) by 1102 days.

(21) Appl. No.: 11/333,989

(22) Filed: Jan. 17, 2006

(65) Prior Publication Data

US 2007/0222013 A1 Sep. 27, 2007

(51) Int. Cl.
*H01L 27/00* (2006.01)

(52) U.S. Cl. .................. 250/208.1; 250/214 R

(58) Field of Classification Search .............. 250/208.1, 250/214 R, 214.1; 257/414, 784, 24, 431, 257/368, 7, 666–678; 438/287, 427; 977/789–796, 977/952–954; 348/208.99, 217.1; 396/108, 396/111, 120; 398/132
See application file for complete search history.

(56) References Cited

U.S. PATENT DOCUMENTS 7,129,554 B2 * 10/2006 Lieber et al. ................. 257/414

\* cited by examiner

*Primary Examiner*—Que T Le

(57) ABSTRACT

The invention provides an imaging device comprised of nanoscale crossbar arrays upon a transmissive medium. The preferred embodiment employs a BOPET film as the transparent material bearing addressable nanoscale arrays, and the arrays connected to leads through micro lithographic techniques, and in turn connected to a logic device. An imaging volume is provided by stacking the array-bearing sheets. The volumetric imaging device functions omnidirectionally. By means of applying Fourier and/or geometric optics techniques to imaging data, various focal points and planes of focus can be calculated. The preferred embodiment is on the order of 1 cubic mm. Alternate embodiments include display and projection devices.

39 Claims, 19 Drawing Sheets

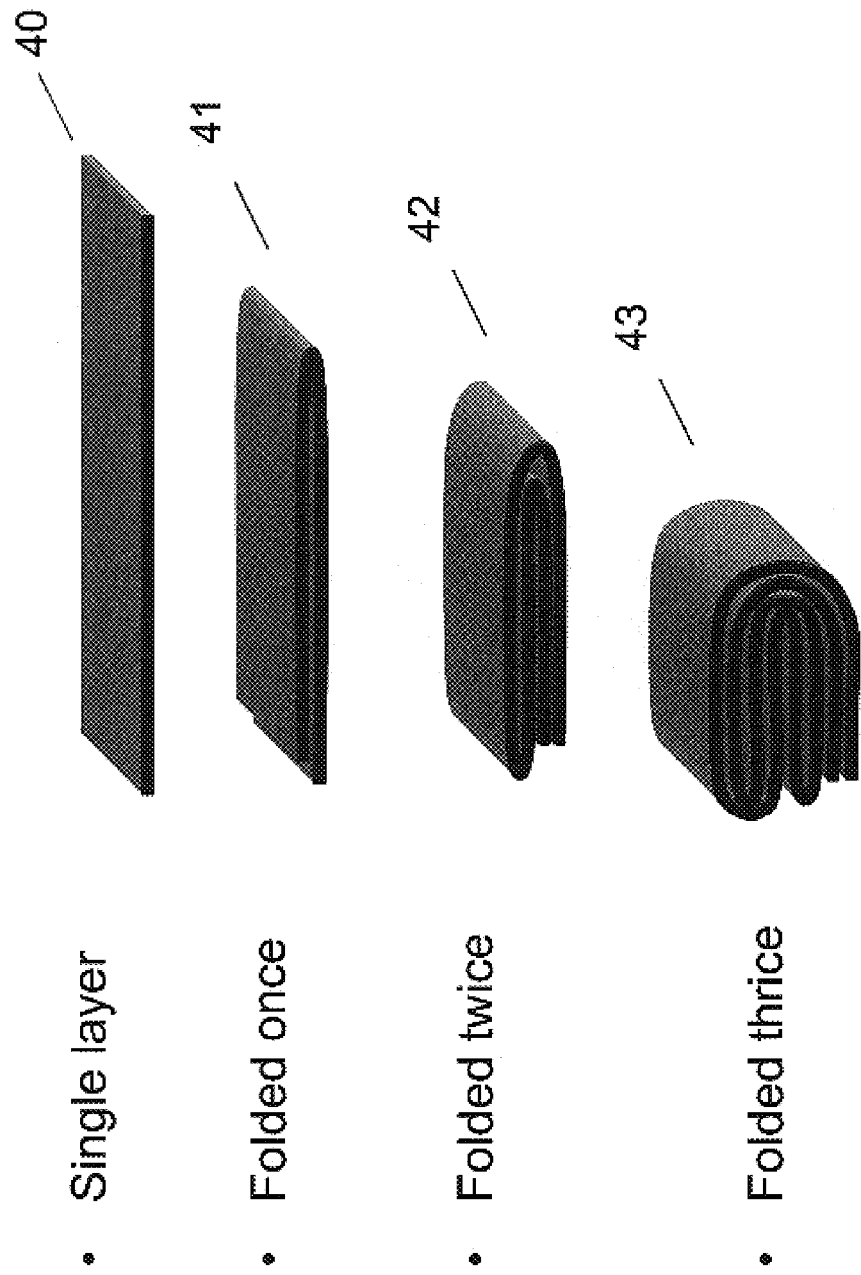

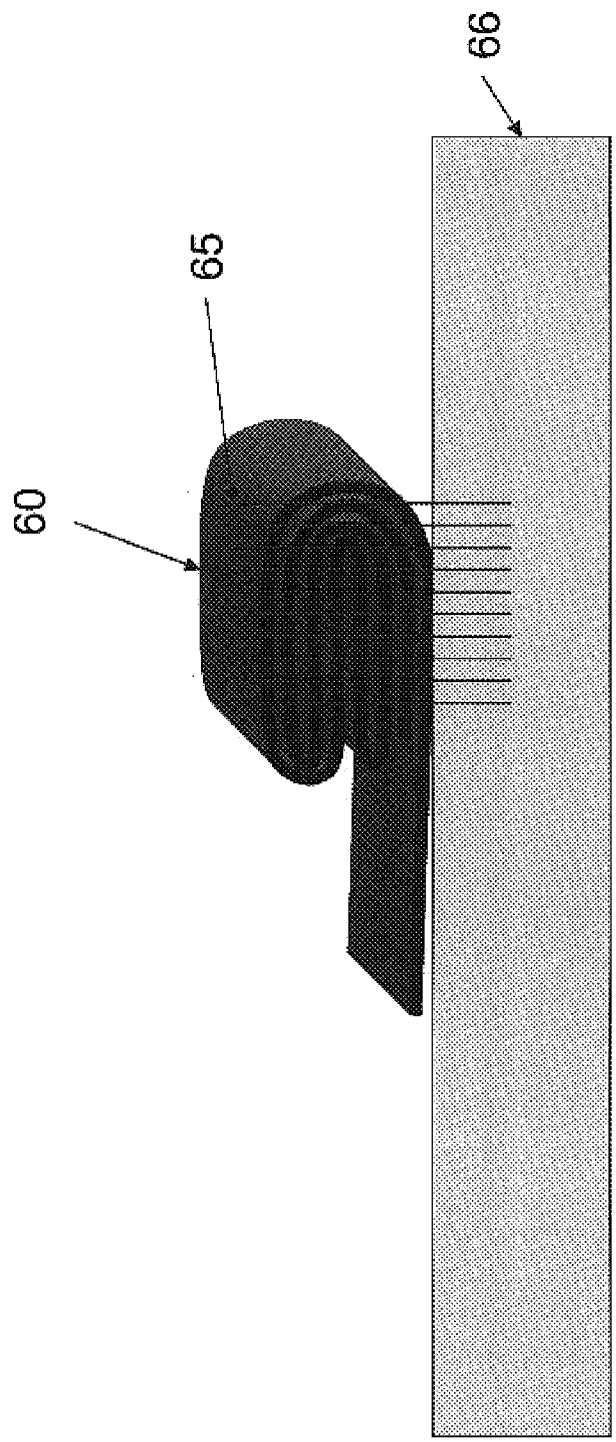

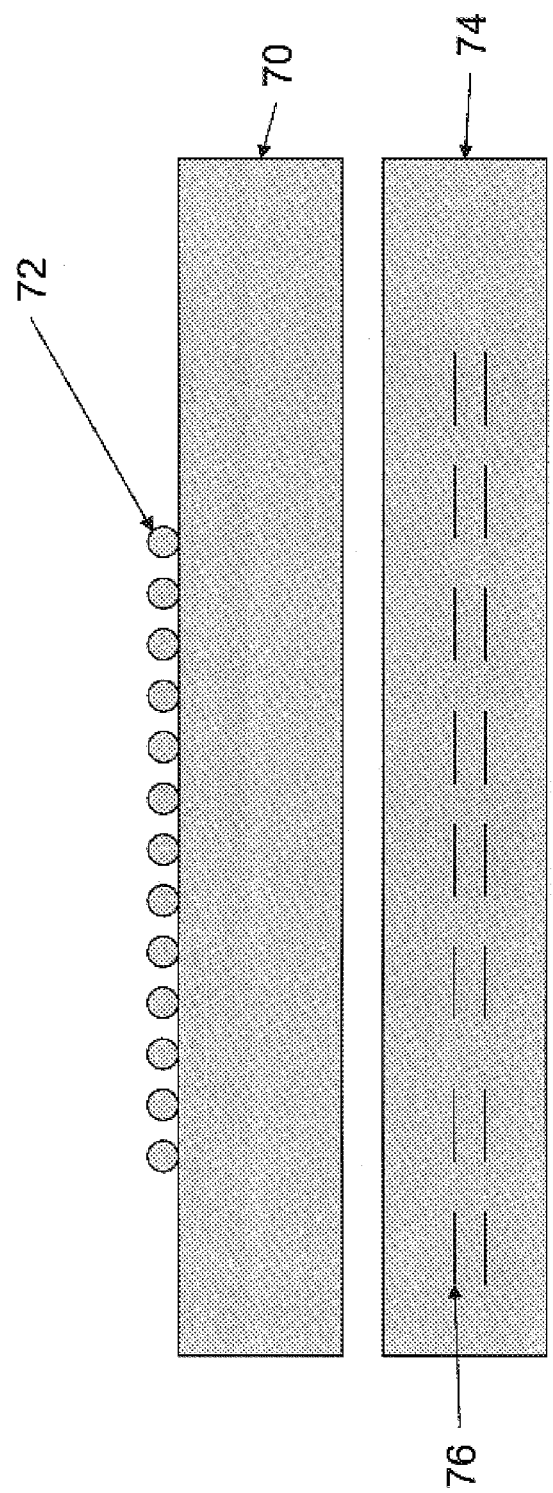

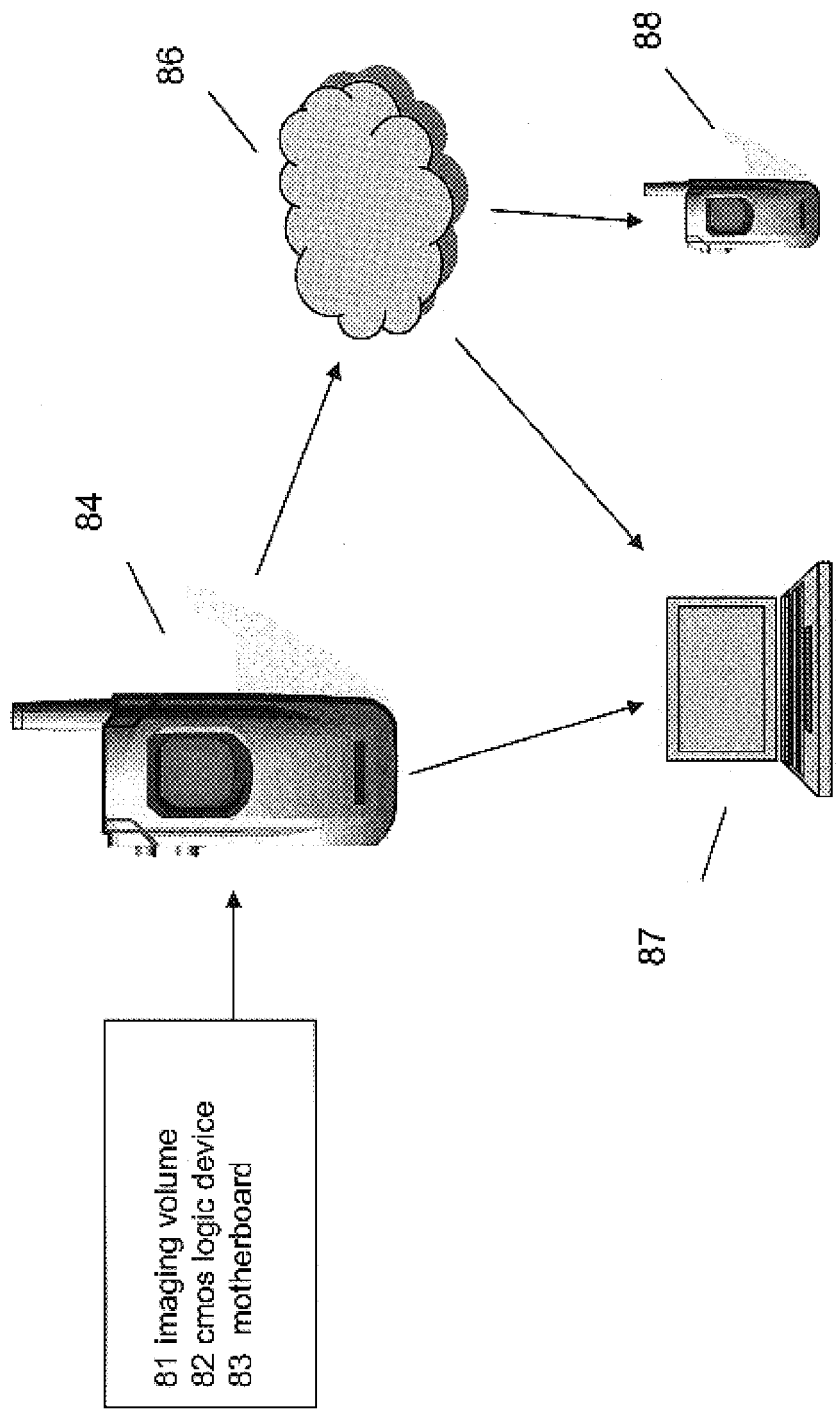

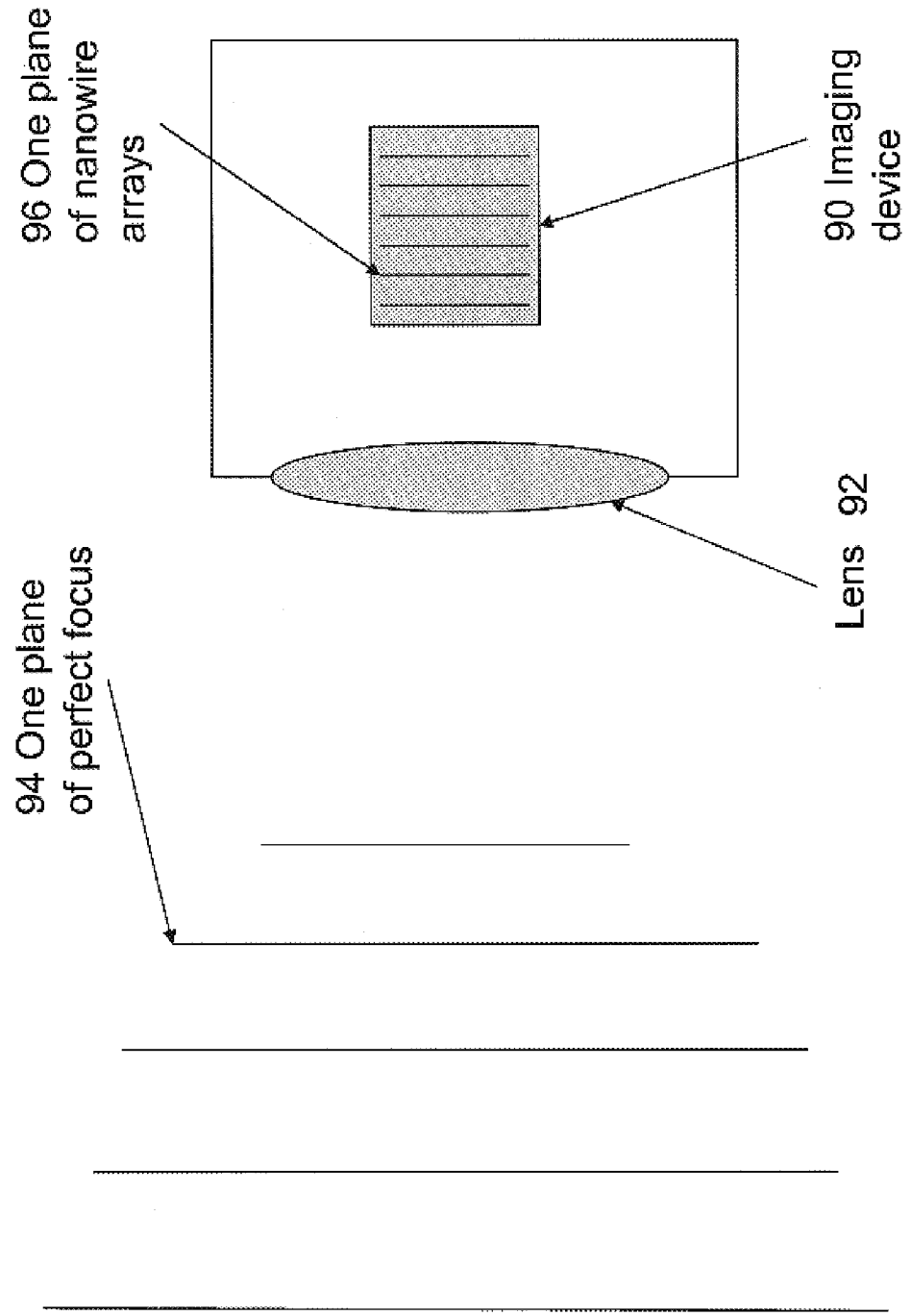

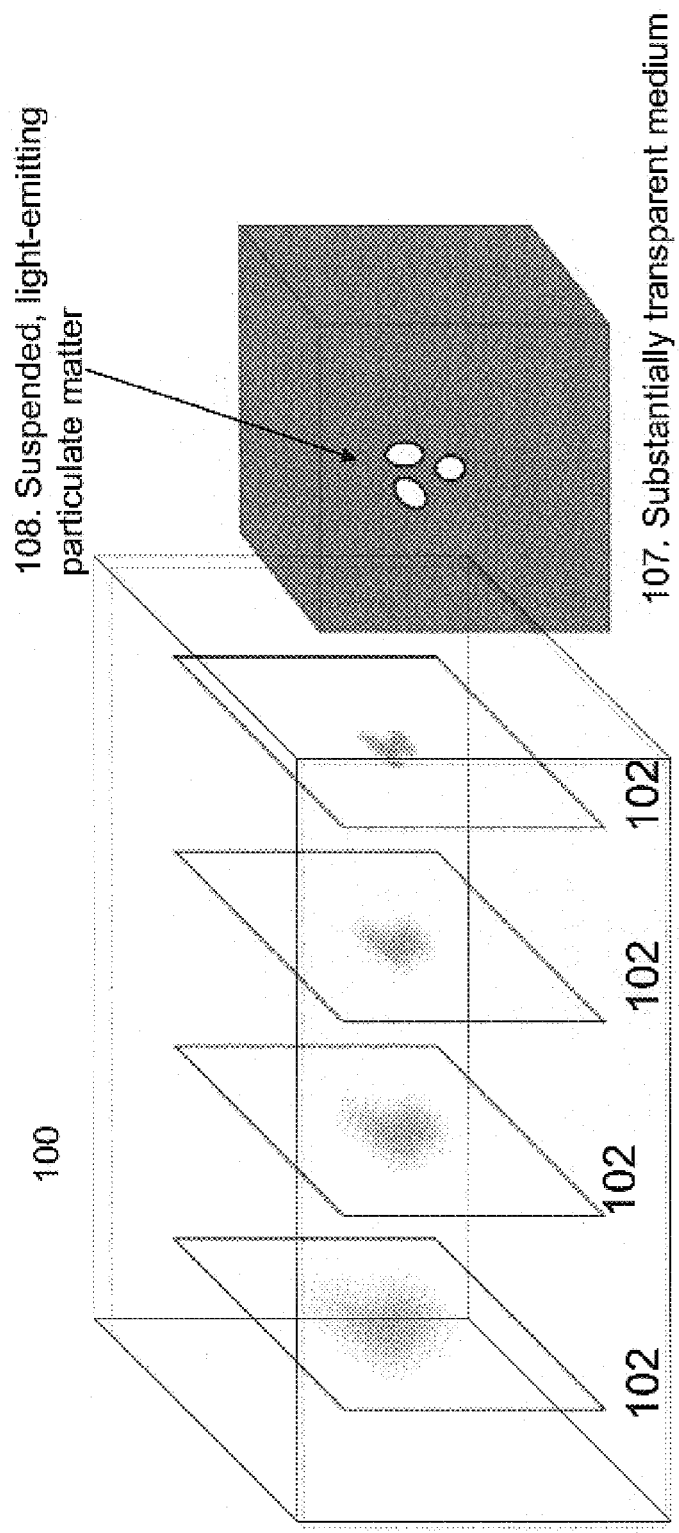

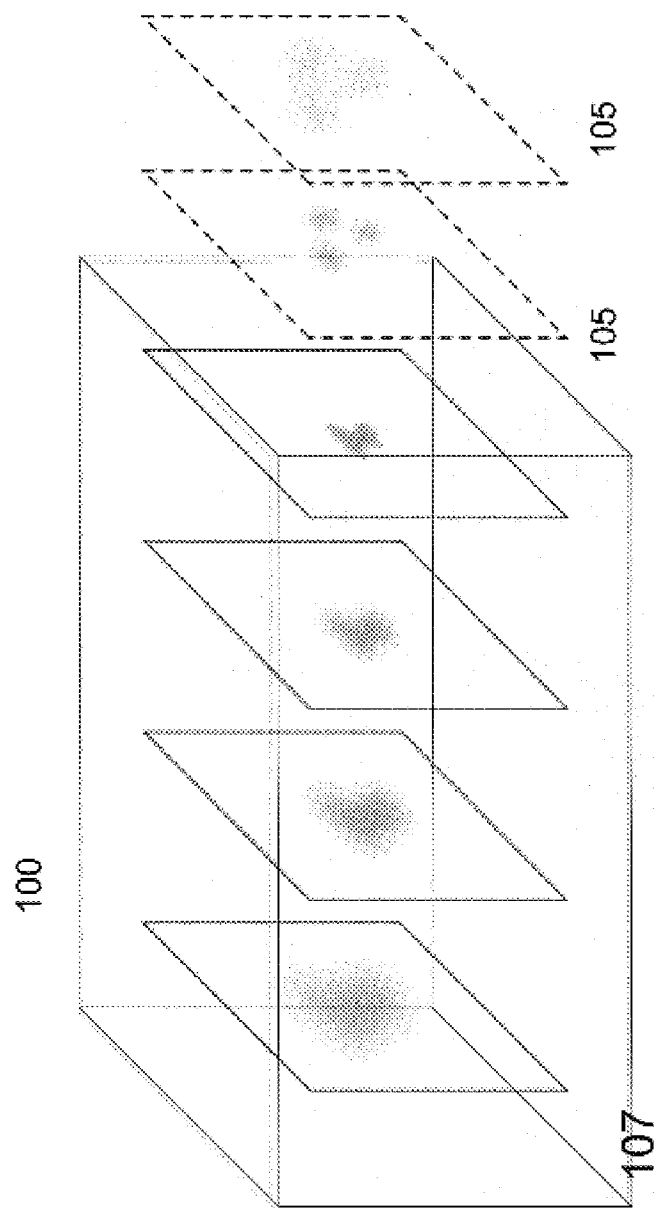

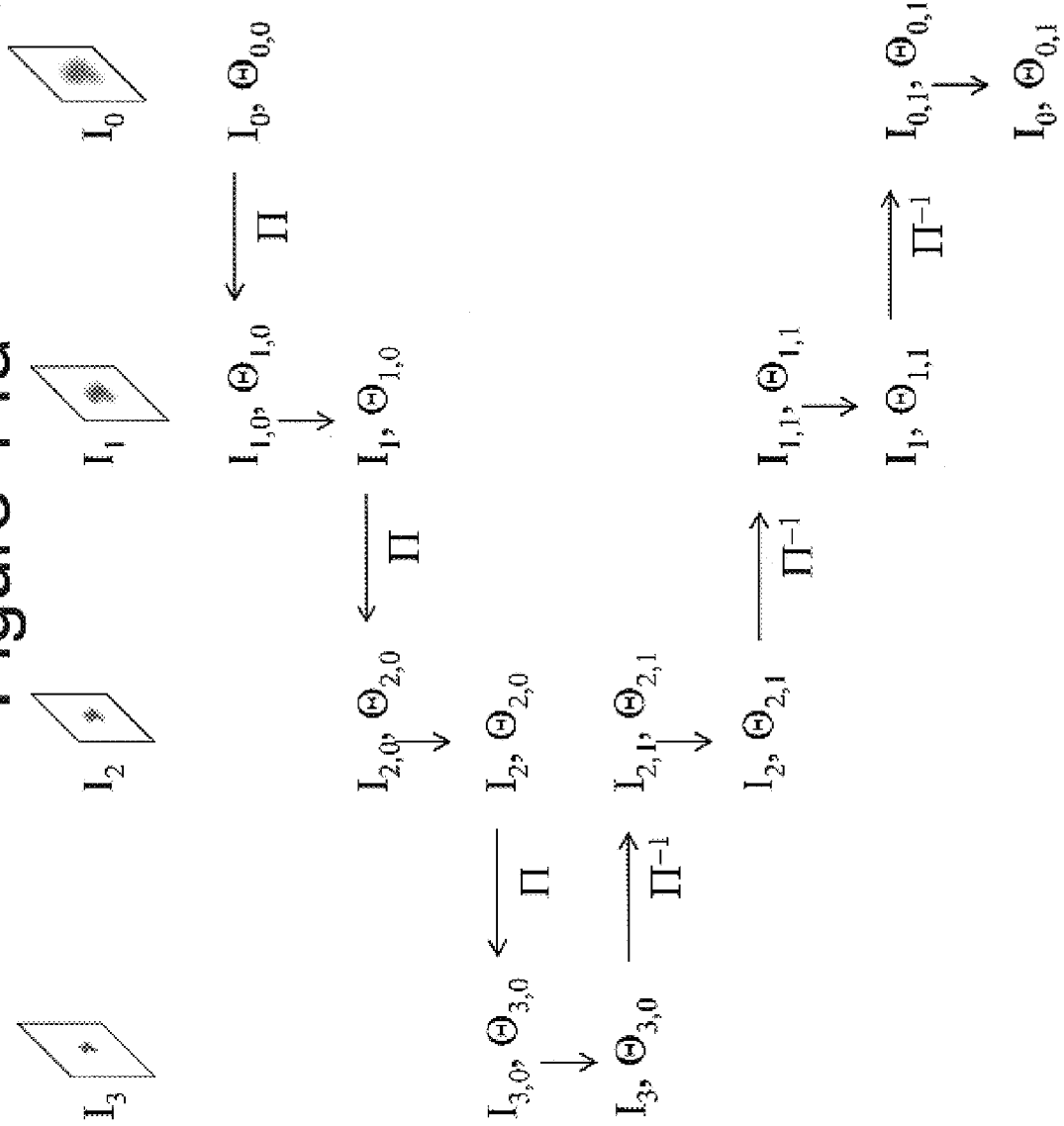

112. Exemplary point at which the light intensity is known or is to be determined.

113. Fiber of direction (cotangent) bundle over exemplary point, 112, and fractional intensity distribution on it forming auxiliary data set.

NANOSCALE VOLUMETRIC IMAGING DEVICE HAVING AT LEAST ONE MICROSCALE DEVICE FOR ELECTRICALLY COUPLING AT LEAST ONE ADDRESSABLE ARRAY TO A DATA PROCESSING MEANS

GOVERNMENT FUNDING

This invention was made, in part, with government support under contract number N00014-04-1-0591 awarded by the office of Naval Research. The Government has certain rights in this invention.

RELATED CASES

Not applicable.

TECHNICAL FIELD

The present invention pertains to imaging and projecting radiant energy, and in particular to nanoscale addressable arrays providing multiple imaging planes and volumetric imaging properties.

BACKGROUND

Imaging devices are ubiquitous as camera phones and digital photography are available and relatively inexpensive. In late 2000, Sharp Corporation made the first consumer camera-phone (the J-SH04) marketed by J-Phone (Vodafone) in Japan. Studies report that in 2004, camera phone sales were four times higher than digital camera sales worldwide, and 60% of mobile phones sold in Japan had camera features. Moreover, the world-wide demand continues for improved image quality as well as lower cost in consumer devices capable of imaging.

One sort of imaging device, a charge-coupled device (CCD), is useful for recording and displaying images, and consists of an integrated circuit containing an array of linked or coupled capacitors. Under the control of an external circuit, each capacitor can transfer its electric charge to one or other of its neighbors.

CCDs containing grids of pixels are used in digital cameras, optical scanners and video cameras as light-sensing devices. Because CCDs commonly respond to 70% of the incident light (meaning a quantum efficiency of about 70%), CCDs are significantly more efficient than photographic film, which captures only about 2% of the incident light.

In CCD devices, an image is projected by a lens on the capacitor array, causing each capacitor to accumulate an electric charge proportional to the light intensity at that location. A one-dimensional array, used in line-scan cameras, captures a single slice of the image, while a two-dimensional array, used in video and still cameras, captures the whole image or a rectangular portion of it. Once the array has been exposed to the image, a control circuit causes each capacitor to transfer its contents to its neighbor. The last capacitor in the array dumps its charge into an amplifier that converts the charge into a voltage. By repeating this process, the control circuit converts the entire contents of the array to a varying voltage, which it samples, digitizes and stores in memory. Stored images can be transferred to a variety of output devices, including, for example, a printer, storage device or video display.

In consumer devices, there is a desire for the imaging device, whether such device be for image capture or image display or both, to be smaller, lower cost and "fool proof" (i.e., capable of producing a satisfactory image without any skill on the part of the operator). The expectation exists that images will increase in resolution. Current camera phones, for example, provide good resolution, with some models capable of as much as 7 megapixels (e.g., the Samsung SCH-V7700). Therefore, an imaging device capable of providing high resolution images is also desired.

Another expectation is the ability to take photographs or other images without having to explicitly set a focal depth.

Another expectation along with increased resolution is the recording of three dimensional (3D) position information.

What is needed is an imaging device that is inexpensive to manufacture and compact, with no moving parts and capable of focusing automatically. What is also desired is a single imaging device capable of recording position information in three dimensions.

BRIEF SUMMARY OF THE INVENTION

The invention taught herein meets all the needs stated hereinabove. The invention teaches an imaging device capable of recording 3D position information, that has no moving parts, that is automatically in focus, even though the lens (if any) is fixed, and which is both small—on the order of 1 mm cube—and extremely inexpensive to manufacture.

The invention provides an imaging device comprised of nano-wire crossbar arrays ("arrays" or "addressable arrays") on a radiant energy transmissive medium. The preferred embodiment employs sheets of BOPET film as the transmissive material. The arrays are connected to leads through micro lithographic techniques, and in turn connected to a storage device, e.g., flash or disk memory. A means for processing and transmitting the processed image data to a display means are included in the inventive device. While a single array-bearing sheet so connected may store, transmit, and enable the display of an image, the preferred embodiment is a 1 mm cube containing about one-thousand array-bearing sheets. Each sheet, taken together with any coating that may be on the sheet (e.g., to affix the nanoscale devices), is preferably less than one micron thick.

The stacking of the array-bearing sheets produces a volumetric hologram, amenable to display a selected image omnidirectionally, from any point of focus, by means of applying Fourier transforms to the stored data. An imaging device according to the preferred embodiment is compact, with the stacked array-bearing sheets being on the order of 1 cubic mm. If the associated electronics for storing, processing and transmitting the image data are considered in the measurement, then a device according to the present invention may be approximately 2 cubic mm.

The nanowires may be affixed to a sheet of transmissive medium using the Langmuir-Blodgett technique. Manufacturing costs for this stage are quite low, as affixing the wires to the sheets can be accomplished by swiping a sheet though a suspension of nanowires followed by a second swipe, with the sheet rotated ninety degrees, thereby orienting a first and second layer of nanowires substantially orthogonally, in a "cross bar" manner. Alternately, a separate second substrate may be swiped through the nanowire suspension, and then through further processing steps the wires can be transferred from the second substrate to the sheet.

The array-bearing sheets may vary in thickness (from about 100 to 300 nanometers), as do the wire dimensions (diameter and length), however, in the preferred embodiment the inter sheet and inter wire distance should be the same. The array may be composed of about one thousand wires crossed by one thousand wires. In the preferred embodiment, the sheets are less than one micron in thickness (including any coating); wire diameters are between about 3-50 nanometers and wire length ranges from about 10 to 1000 microns.

A large array-bearing sheet may be folded ten times or rolled a similar amount to produce a cube or cylinder of a thousand layers. The connectivity of arrays on the folded sheet cube is greatly simplified. The sheet itself may be configured to preserve an overhang or flap or tag or "tongue", and the tongue may bear contacts (CMOS chip pads). Traditional micro TAB or other wire binding techniques may be employed to achieve connectivity. Alternatively, connectivity may be established by means of capacitive coupling, thereby obviating the need for the wiring process and the attendant heat generated during conventional wiring processes.

The invention provides in-focus imaging with or without the use of a lens. The invention provides a sufficiently regular array enabling use of standard Fourier and geometric optics techniques to compute, from the image data, the amplitude image that would have occurred if there were a lens of any particular focal length in place, or if the imaging plane were in locations outside of the cube.

The invention further provides a means for infinite depth-of-field focus when using a fixed lens. Provided is the ability to selectably focus after the image has been recorded (one image with the foreground in focus, another with the background in focus, etc.). Simple edge detection algorithms can be applied to find the layers with the highest and sharpest contrast in edges thereby informing the selection of which plane from which to pick images for each region of an image. Moreover, with multiple planes of sensors, 3D position information is recorded in the combination of recorded images.

BRIEF DESCRIPTION OF THE DRAWINGS

FIG. 3b depicts an alternate embodiment of the device depicted in FIG. 3a.

FIG. 4a illustrates an alternate array-bearing sheet assembly configuration (i.e. folded sheet).

FIG. 6 illustrates an aspect of the preferred embodiment i.e. connectivity of array-bearing sheet via capacitive conductance.

FIG. 7 illustrates an array-bearing sheet comprised of two layers (nanoscale devices on a first layer; microscale devices on or in a second layer).

FIG. 8 depicts conceptually an imaging device according to the present invention embedded in cell phone camera and interconnecting with display devices.

FIG. 9 illustrates the planes of focus provided by an imaging device according to the present invention.

FIG. 12 depicts radiant energy emitting sources within a volume of substantially transmissive material.

FIG. 13 illustrates computed radiant energy intensity distributions for a device as in FIG. 12.

FIG. 14a illustrates schematically data generation enabling computation of radiant energy intensity at unmeasured planes.

DETAILED DESCRIPTION OF THE PREFERRED EMBODIMENT

Figure 1:
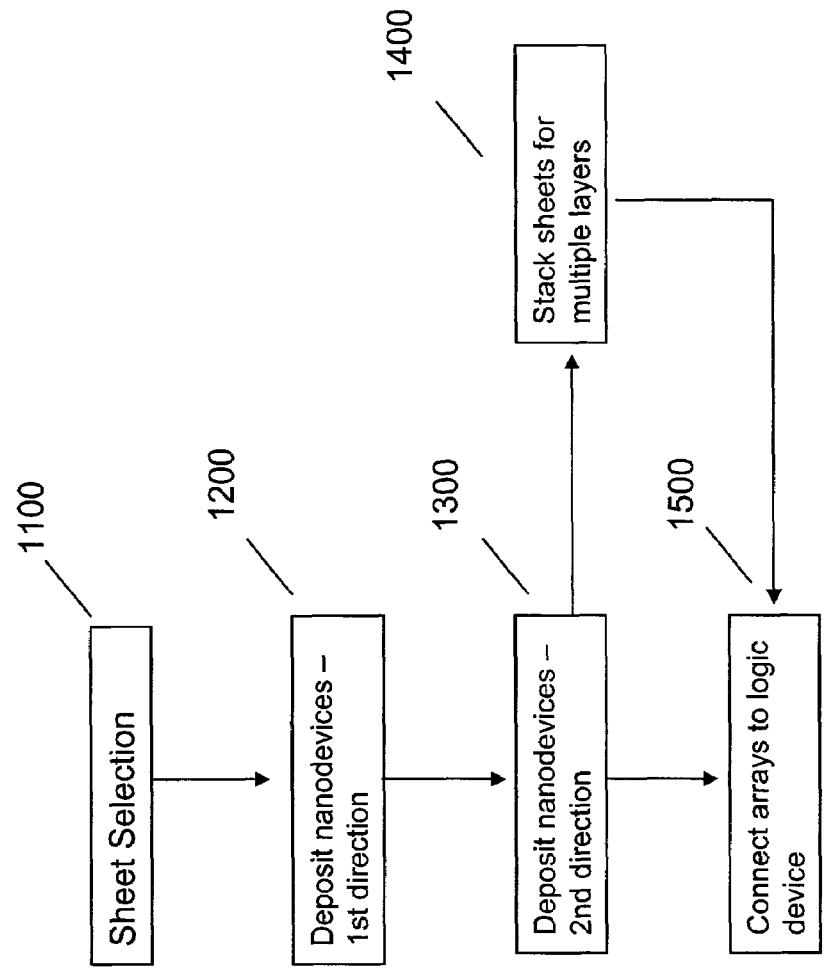
FIG. 1 is a flowchart illustrating method for assembling a sheet with nanowires or other nanoscale devices to form an addressable array.

Introductory note: This section begins with definitions, then a method known in the art for assembling nanoscale addressable arrays is briefly outlined. An example of the inventive nanoscale volumetric imaging device as used in a cell phone camera is described, followed by a description of how the nanoscale volumetric imaging device operates, and some examples of the mathematical models useful in the image processing and display. While some examples specifically refer to visible light, the invention is applicable to all wavelengths of radiant energy.

Definitions: A selection of key terms as they are to be understood herein, including the specification, drawings and claims, are defined below for reader convenience. A definition in the singular includes the plural.

Addressable array: a nanoscale cross bar array as defined by Leiber et al., US publication number 20050117441 (incorporated herein by reference), which is addressable. The addressable array may be composed of nanoscale devices, such as, for example nanowires or any radiant energy sensitive nanowire like devices as well as a means for connecting the nanoscale devices to microscale input/output. Some approaches for such nano-microlithography are taught in U.S. Pat. No. 6,963,077 (incorporated herein by reference) and are compatible with the device taught herein. Herein, "array" means "addressable array" unless explicitly stated otherwise.

Array-bearing sheet: any transparent material of a predetermined thickness bearing at least one addressable array, wherein said array includes some nanowire-like or other nanoscale devices sensitive to radiant energy.

Capacitive coupling: a means for electrically connecting devices; see, for example, "Manufacturability of Capacitively Coupled Multichip Modules", Thomas F. Knight, Ph.D. and David B. Salzman, Ph.D. 1994 IEEE pp. 605-608 (incorporated herein by reference).

CCD: charge couple device; any of a family of CCD-based imaging devices.

Image: a representation of radiant energy that impinged upon an addressable array. An image may be machine readable or displayed in a manner sensible to the human eye. As used herein, "image" may also be understood to include the data portrait, actual or virtually reconstructed, obtained or derived from radiant impingement on an addressable array.

Imaging plane: a two-dimensional surface in space whose interception of impinging light defines an image.

Langmuir-Blodgett: a process or set of processes amenable for a wide variety of applications and particularly adaptable for depositing nanoscale devices in a crossbar array on selected sheet material.

Light intensity distribution: an assignment of a value to points in a spatial region of the light energy impinging on each point.

Logic device: any device capable of operatively interacting with the addressable array and performing all or some of the functions of amplifying, storing, processing, and transmitting the output from the array. Includes, but is not limited to, the CMOS family of integrated circuits.

Microscale fabrication devices: microscale wires or the equivalent in conductive association with at least one addressable array.

Nano: "nano", alone or in combination with "scale" (i.e. nanoscale) or any other term, is meant to include elements of widths or diameters of less than 1.mu.m Nanowire: structures as described by Leiber USPTO publication number 20050117441 (incorporated herein by reference). A "wire" refers to any material or combination of materials having a conductivity of any semiconductor or any metal including, but not limited to nanorods, nanowires, organic and inorganic conductive and semiconducting polymers. One variety of nanowire is formed by "growing" a layer of some other substance on the outside of an existing wire. By an annealing process, the outer shell can become highly crystalline, but it will not be as perfect as the inner core nanowire. The junction between the core cylinder wire and the outer shell hollow cylinder is (potentially) radiant energy sensitive along the entire length, leading to an electrical potential when radiant energy hits anywhere along the wire. By contrast, most of the existing studies have been on one of the other two embodiments: a) a crosspoint junction of two different substances or b) a butt-end junction between two wires abutted end-on. For these cases, the radiant energy has to hit the region where the two substances meet, which will be a small fraction of the entire wire volume. Another embodiment is based on substances that are selectively conductive under exposure to radiant energy; thus conductivity between two nanowires varies greatly depending on the degree of radiant energy striking the intervening substance.

The preferred nanowire for the invention is a core-shell (Si inner, Ge outer) and the array would include a first layer of conductive wires, and a second layer of the Si—Ge core shell wires. Other compound semiconductor materials including Gallium Arsenide, GaAs, and Indium Phosphide, InP, can be used. CdS nanowires, $Cu_2S$/CdS core-shell structures, $Cu_2S$ with Au nanoparticles and other combinations can also be used.

Nanoscale device: any device of nano dimensions capable of homogenously or heterogeneously participating in an addressable array. As used herein, participation is understood to mean directly or indirectly being sensitive to radiant energy, including, but not limited to, wavelengths visible to the human eye. A nanoscale device may be composed, in whole or in part, of nanowires.

Radiant Energy Transform system: an arrangement of elements, (such as, for example, where such a system is an optical transform system, lenses or other refractive elements and/or gratings and other diffractive elements) to predictably transform the character of incoming radiant energy on exit.

Stack (stacking): two or more array-bearing sheets closely associated in such a manner so that conditions enabling a volumetric hologram exist; process of bringing about such an association of array-bearing sheets.

Transparent material: any material transmissive to radiant energy and suitable for sheet formation and capable of bearing an addressable array. In the preferred embodiment, the transparent material is a biaxially-oriented polyethylene terephthalate (BOPET) polyester film. Herein, "sheet" refers to transmissive material. Sheet thickness can vary. Individual sheets may be thin (about 100 nanometers) or of a thickness three or more times greater: approximately 300 or more nanometers. In the preferred embodiment, the inter sheet and the interwire distance ideally are close to being equal.

Volumetric hologram: an assembly that captures and/or reconstructs the three dimensional structure of impinging radiant energy through the interaction of the radiant energy with spatially (rather than planarly) distributed wavelength-scale elements.

As the inventive volumetric imaging device may be understood as a stack of array-bearing sheets, it is useful to begin with a brief description of nanoscale array assembly. An array assembly method as outlined in FIG. 1 provides a general approach for depositing addressable arrays on a sheet. First, a sheet is selected 1100. The preferred method of getting the nanoscale devices parallel to a first surface of a given sheet is that used to create a Langmuir-Blodgett (LB) film. An LB film is a monolayer, a set of monolayers, or a multilayer deposited from liquid onto a solid substrate wherein the resulting film properties are controllable.

As applied to this invention, the next two steps are: a first swipe 1200 of a sheet through a suspension of nanowires or nanoscale devices whereby a first layer of nanoscale devices are deposited on the sheet surface in a substantially parallel alignment; and a second swipe 1300 through such a suspension, orienting the sheet at a 90 degree rotation from the first swipe, resulting in a second layer in crossbar formation with respect to the first layer. The variations to this general method of nanodevice deposition and crossbar formation will be apparent to those of skill in the relevant art, and are included in the invention as taught herein.

The two nanodevice layers in crossbar formation comprise an addressable array. Once the array is formed, if only a single sheet is to be used, then the next step is connection to a logic device 1500. Such connection may be accomplished with known lithographic techniques, and small-scale wire leads from the array to a logic device which, in turn, preferably connects to a recording media such as flash memory or hard disk.

In the multilayer embodiments (which includes the preferred embodiment) the step of stacking sheets 1400 or folding a sheet or sheets to produce approximately about one thousand or so layers may be performed before connectivity to a logic device 1500.

In the preferred embodiment, nanowires are used as the nanoscale devices. Various methods of nanowire production exist; this invention is not limited as to the manner in which nanowires are produced. Typically the nanowire diameters are of about 3 to 50 nanometers; wire length about 10 to 100 microns. An array consists of about 1,000×1,000 nanowires, or nanoscale devices or smaller arrays electrically bridged so as to collectively make up an array of 1,000×1000 nanowires.

Figure 2:
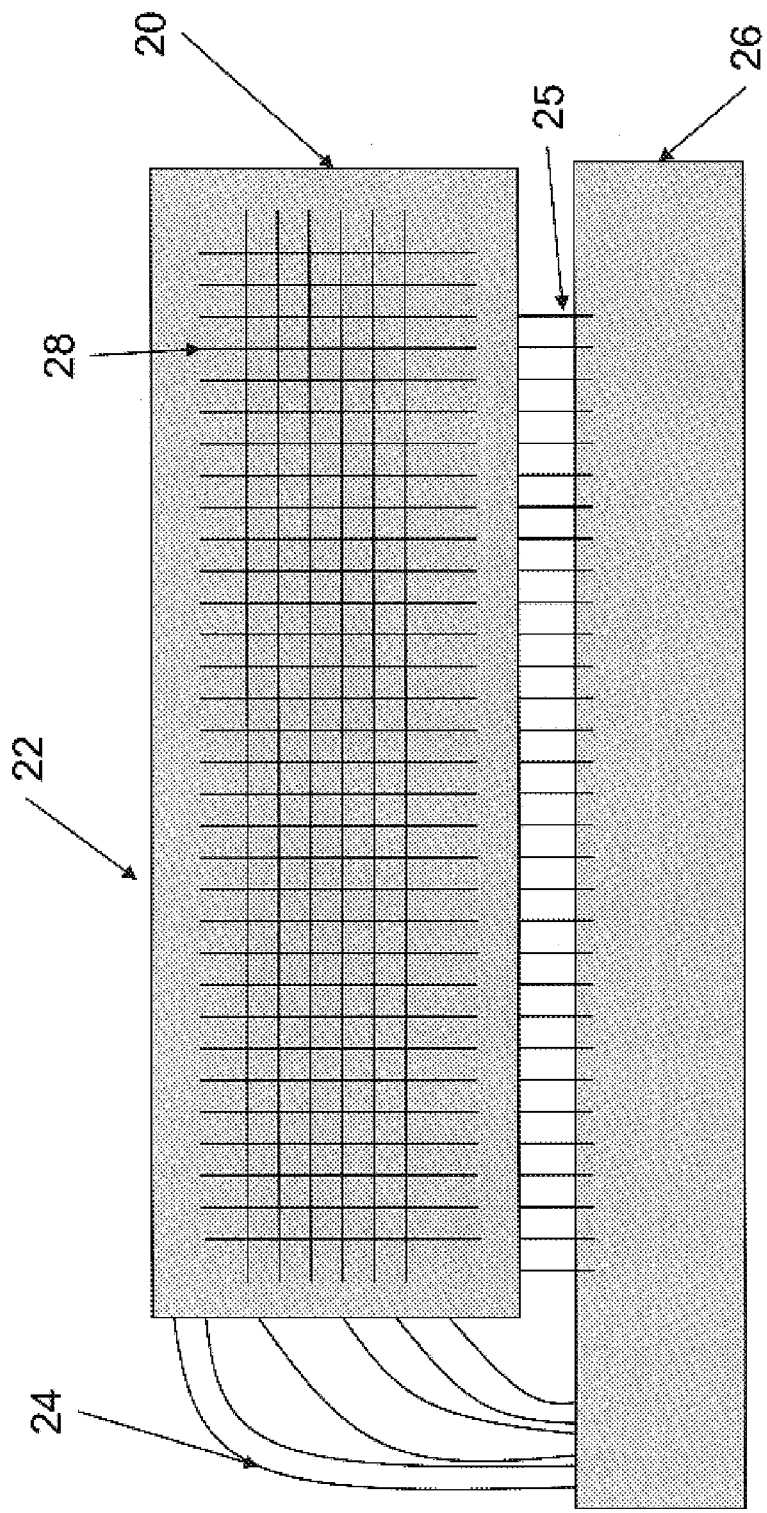
FIG. 2 depicts an array-bearing sheet connected to CMOS logic device.
Figure 3A:
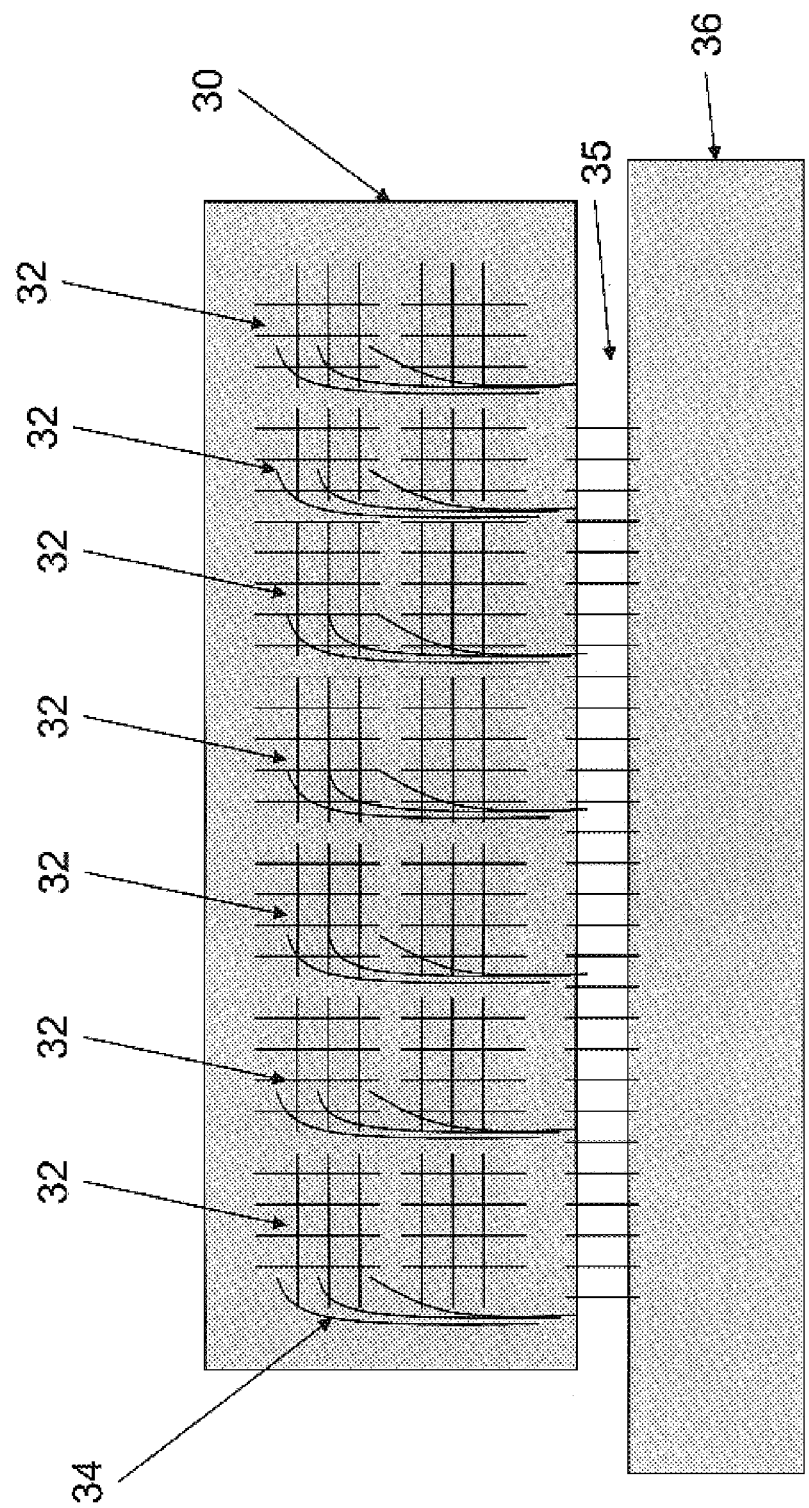
FIG. 3a depicts the device of FIG. 2 with multiple arrays.
Figure 3B:
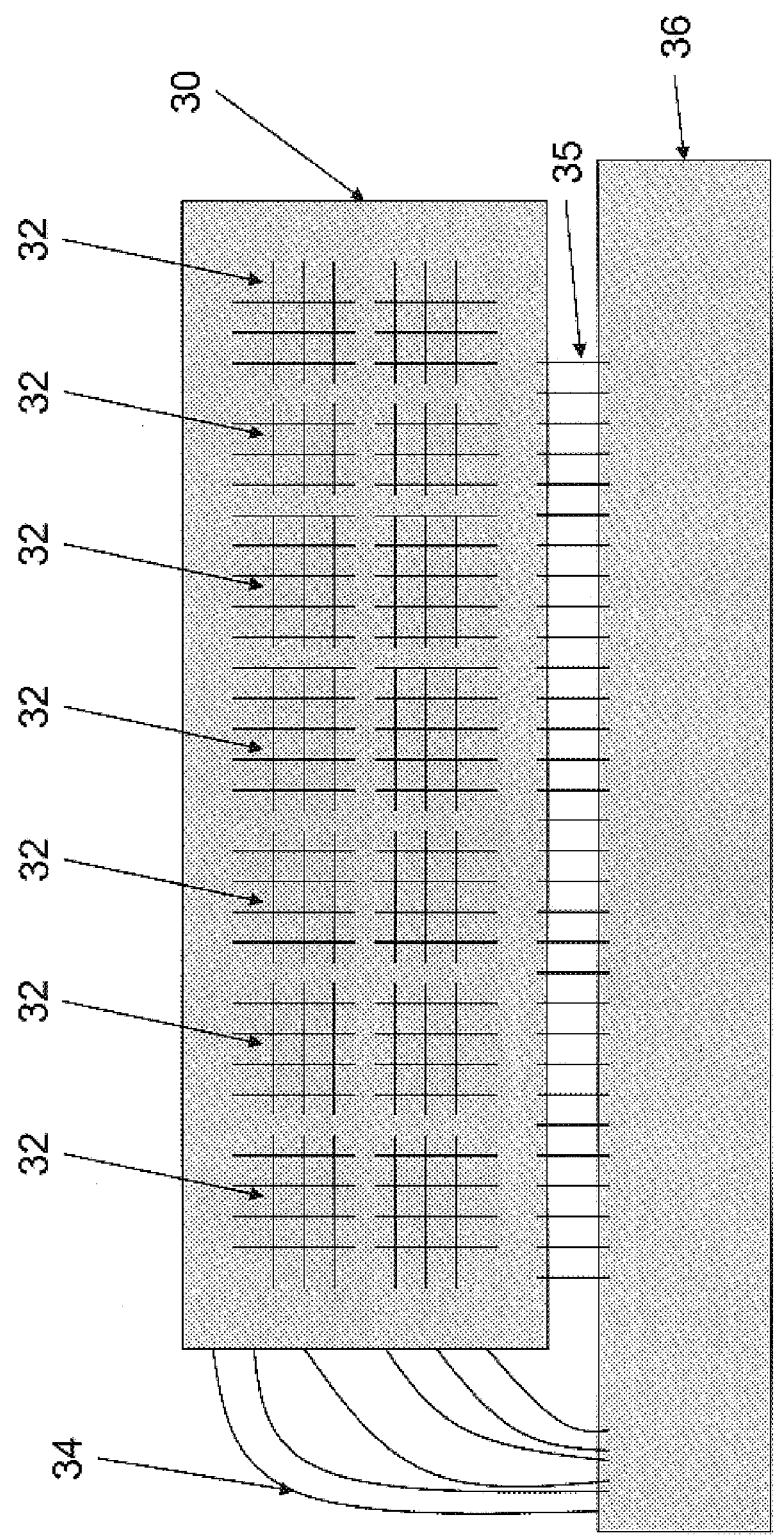

Nanoscale arrays on transparent material are depicted in FIGS. 2, 3a and 3b. FIG. 2 depicts an array bearing sheet 20 connected to logic device 26. A single array 22 is depicted. Endpoints 28 of nickel, for example, fix the array wires at their endpoints and prevent misalignment and malfunctioning of the array. Microscale devices—wires—24, 25 are used to electrically couple the nanoscale array 22 to the logic device 26. FIGS. 3a and 3b depict the device of FIG. 2 with multiple arrays 32, on a single sheet 30, a logic device 36 and microscale devices 34, 35 connecting each array 32 to the logic device. FIG. 3a sacrifices array surface area owing to array wiring, and FIG. 3b preserves array surface (otherwise non-transmissive by the presence of connecting wires) by bridging each array 32 with a bridge of substantially transmissive material (not depicted) and wiring across the entire row 34. The preferred materials (for nanowires, microscale wires and contacts) are materials selected to minimize interference and are as transmissive as possible.

Stacking. One approach to stacking sheets is folding a larger sheet into a multi folded (and multi layered) sheaf, which may produce a cube shape. FIG. 4*a* depicts a sheet 40 folded three times 43; ten folds will obtain one thousand layers, approximately the number of layers used in the preferred embodiment.

Figure 4B:
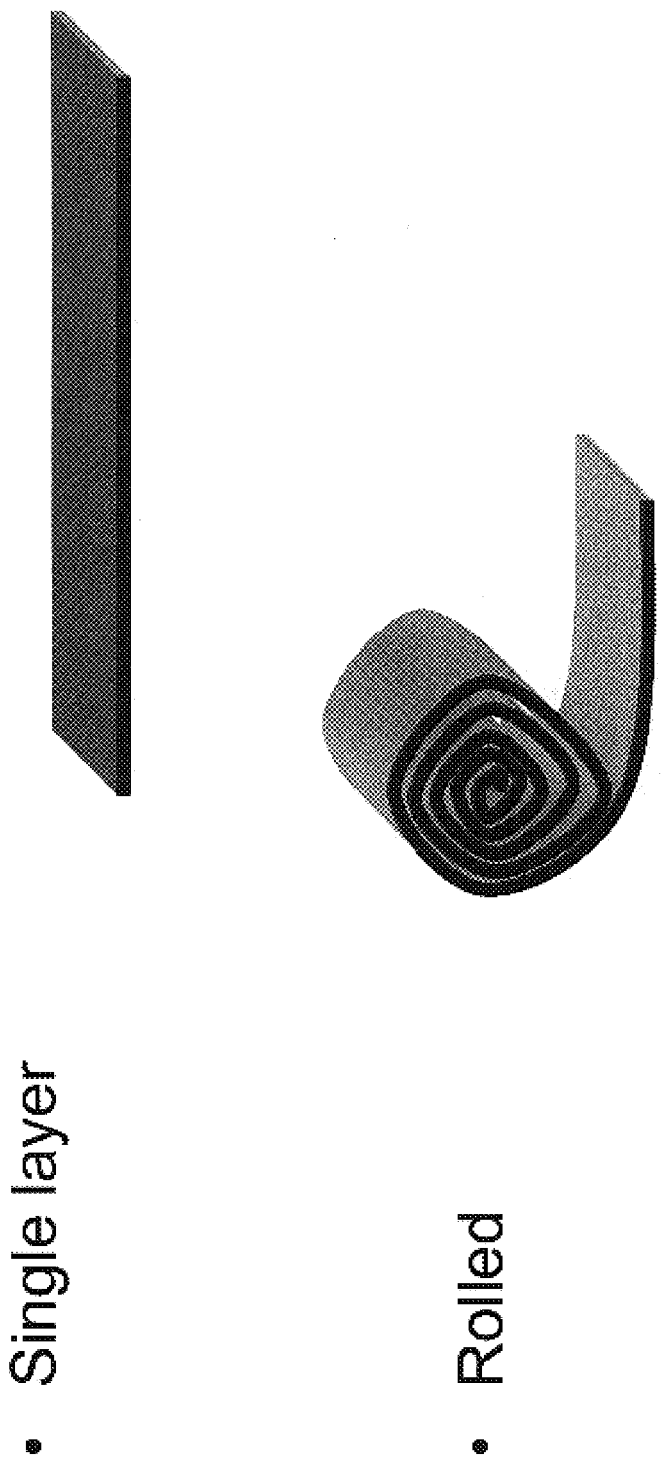
FIG. 4b illustrates an alternate array-bearing sheet assembly configuration (i.e. rolled sheet).

Folding and Rolling. Referring to FIGS. 4*a* and 4*b*, the multilayer assembly may be accomplished by folding (FIG. 4*a*) or rolling (FIG. 4*b*) an array-bearing sheet. 40. It is apparent that a sheet of 100 nanometers thickness and a square meter in size, folded ten times results in a cube 1 mm thick with 1,000 layers of array-bearing sheets. Alternatively, a sheet can be rolled or folded in one direction and sliced at 1 mm intervals, yielding 1 mm×1 mm×1 mm shapes. Cube, ellipse or cylinder: no shape requirement need be imposed. A sphere or any other shape may be used; at present a cube-like shape is preferred. In an alternate embodiment, layers are stacked in a skewed fashion, that is to say, aligned at an offset or otherwise adjusted in orientation so as to reduce shadow effects.

Shadow effects as used herein means effects on layers furthest from the radiant energy source (the "back" of the cube) resulting from the elements in earlier layers (nanowires, microscale wires, contacts) affecting the passing radiant energy. Other ways of stacking and assembling array-bearing-sheets so as to minimize shadow effects and alternate sheet stacking configurations will be apparent to those of skill in the relevant art.

The nanowires are almost invisible to the human eye even when there is a dense layer of them, and even when assembled onto a transparent sheet. Nonetheless, it may be desirable to engineer refractive-index-matched coatings that lessen the optical effects. At present, elements, including contacts and microscale wires, are selected that are as transmissive as possible at the thicknesses employed.

One can appreciate that a "roll" assembly method is fairly similar to a "fold" when considering on the order of one thousand layers. In a large scale operation the step of cutting after rolling or folding is included. Of course, one could just make one thousand or so separate layers and simply stack them up (without any explicit folding or rolling). Any and all such assembly techniques are intended to be included herein.

Connectivity. The currently preferred lithographic approach to electrically coupling the addressable array is described in U.S. Pat. No. 6,963,077, issued to inventors De Hon, et al., entitled "Sublithographic Nanoscale Memory Architecture" (incorporated herein by reference). Microscale devices, typically wires, are in connective association with the addressable array.

Figure 5A:
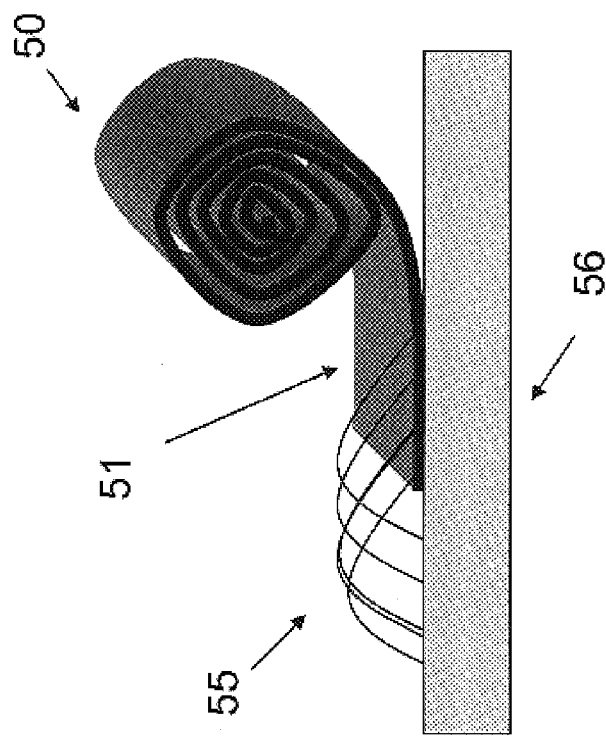
FIGS. 5a and 5b, inclusive, illustrate multilayer embodiments of the imaging device and connectivity to a logic device.
Figure 5B:
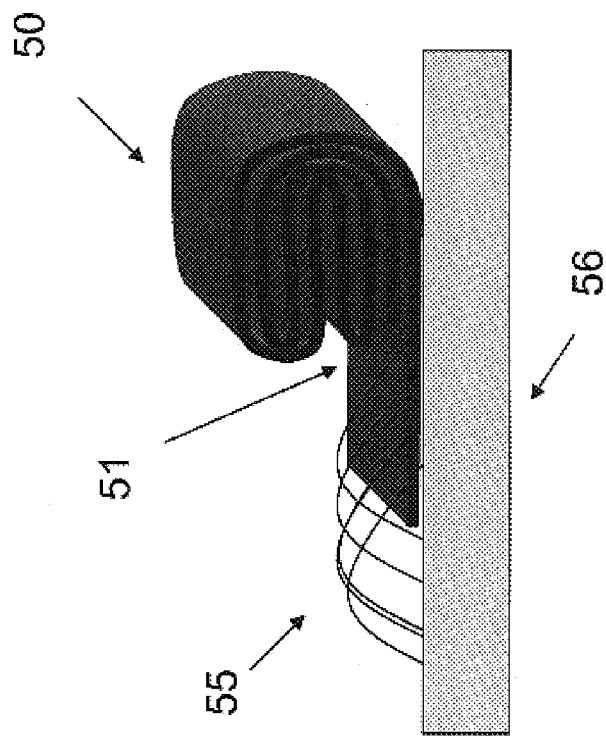

FIG. 5*a* and 5*b*, inclusive, illustrate a multilayer embodiment of the imaging device and connectivity to a logic device. In FIG. 5*a* the array-bearing sheet 50 is folded, in 5*b* the array-bearing sheet 50 is rolled in one direction, leaving a slight tongue 51 or tag protruding from the roll in each case. A first set of microscale devices (not depicted) on the tongue 51 connect the addressable array; a second set of microscale devices 55 connect the array to the logic device 56.

FIG. 6 illustrates the preferred embodiment, particularly depicting connectivity of an array-bearing sheet in a layered formation via capacitive conductance. Similar to FIGS. 5*a* and 5*b* in that the sheet 60 is folded or rolled in one direction, the preferred embodiment is urged into a rectilinear-like shape (e.g., a cube). Instead of the microscale device 55 bearing tongue 51 as in FIGS. 5*a* and 5*b*, a first set of microscale devices 65 run down a face of the cube. Connectivity to the logic device 66 is by means of capacitive conductance. Capacitive conductance connectivity obviates the need for a second set of microscale devices and avoids the exposure to heat suffered during most conventional lithographic procedures. Standard CMOS chip pads (not depicted) are used such that no direct coupling to a sheet is needed.

The microscale wires may be embedded in a sheet and may connect one or more arrays on a single sheet to logic device. FIG. 7 illustrates an array-bearing sheet comprised of two layers (nanoscale devices 72 on a first layer 70; microscale devices 76 on or in a second layer 74).

Compact size. The preferred embodiment of the invention provides a radiant receiving portion of 1 cubic mm. Adding electronic storage, processing and transmission functionality results in a device size of approximately 2 cubic mm. These dimensions are intended for example only, and not intended to be limiting or interpreted as a limitation on the invention.

FIG. 8 presents a conceptual, partially exploded view depicting an application of an imaging device according to the present invention embedded in a cell phone camera. A nano-imaging device 81 according to the present invention is coupled to a logic device 82 and attached to a motherboard 83 and inserted in a cell phone 84. The images from the inventive imaging device 81 may be stored, transmitted wirelessly (via network 86) or in a hardwire manner to a variety of devices 87, 88 including other cell phone viewing screens, or computer displays.

Processing. Although the imaging-related mathematics involved are accessible and apparent to one of skill in the relevant art, a brief discussion is included as a convenience. Standard Fourier and/or geometric optics techniques are used to process array data. The cross-section of nanowires used in the preferred embodiment are comparable to the wavelength of visible light, and the diffraction effects ("shadows") in the described array may be significant. These diffraction effects, however, will encode relative phase (i.e. direction) of the incoming light in the amplitude pattern on the subsequent layers.

Such a regular array of nanowires (nanoscale devices) can, at the same time, serve both as the "reference beam" and the recording medium of a volumetric hologram (see, for example, Smith, H. M. (ed.) *Holographic Recording Materials*. New York: Springer 1977; see also Goodman, J. W. Introduction to Fourier Optics. McGraw-Hill 1966).

While it is possible to omit a lens entirely, an embodiment employing a lens has many attractive features. As depicted in FIG. 9, using a lens 92 in front of the imaging device 90 containing planes of nanowire arrays 96, and simply using the array as if it were several CCDs at a plurality of distances from the lens (and thus with a plurality of planes of focus 94), only as many bits as the image-consumer needs may be required in a device. As the image-consumer may need only approximately two thousand by two thousand nanopixels (in one plane), it may be the case that a single nanowire array will be sufficient for applications such as a camera-phone and such an array can be much smaller than a square mm. Alternatively, if low light sensitivity is desired, nanowires of much larger diameter could be used, the larger wire surface area providing larger targets for photons to hit and, consequently, better light efficiency.

Practically speaking, any device such as, for example, a cell phone camera, using the inventive imaging device can provide images that are in focus. In the preferred (multisheet) embodiment, the inventive device functions analogously to a volumetric hologram. Even in the lens-free embodiments, the inventive device provides three dimensional imaging and selectable focus. Multiple array-bearing sheets assembled according to the invention function like a volume hologram in that the volume hologram, once stored, permits selectable focus depth. Moreover, the volume hologram is omnidirectional—the desired view of the three dimensional image may be selectably accessed.

Of course, some selection of a given plane from which to pick images for each region of an image is required. For example, simple edge detection algorithms can be applied to find the layer with the highest and sharpest contrast in edges in a region of said image. Alternatively, the spatial position of features nearest to the camera (and thus whose image focus is most sensitive to the choice of selected plane) can be determined (further elaborated in the discussion of FIG. 11 following herein below). The plane and region within that plane most appropriate to the image feature so detected is computed by means of the lens law. These regions are extended by several pixels in each direction to facilitate the eventual merging of the resultant captured image fragments. The remainder of the image is then captured at a predetermined plane whose focal depth is near infinity. The image regions so captured can then be combined to produce a single, in-focus image.

The preceding example of a cell phone camera is intended to provide an example of one application of the invention. The following discussion of FIGS. 10 through 15 provides additional examples of the invention when applied to embodiments using visible light, although any radiant energy of any wavelength may be used.

The arrangement of a multiplicity of addressable imaging arrays taught by this invention enables the capture of sufficient information about the incoming radiation to reconstruct in approximation details of the distribution of the radiation at a multiplicity of unmeasured locations, as will be described below. In particular the distribution can be estimated at imaging planes entirely external to the nanoscale imaging device itself. This enables the application of this invention to (1) choose a focal plane beyond the physical limits of the nanoscale volumetric imaging device so that close-in objects can be correctly imaged even without adjusting a lens, (2) locate the position of radiation emitters outside of the volume of the nanoscale volumetric imaging device so that, for example, microscopic fluorescent bodies may be imaged without a lens, (3) combine these properties so that a correctly focused image can be created of a scene with objects of interest at a multiplicity of distances.

In the preferred embodiment of the invention, a propagator is used to model the propagation of radiation from one imaging plane to another. These may include Hamiltonian (geometric optics), Fourier (Fresnel optics), Maxwell (Maxwell's equations), or other propagators. As all these propagators make different idealizations and simplifying assumptions, one skilled in the art will recognize that the appropriate choice of propagator will depend on the characteristics of the incoming radiation and the features important in the intended application. For example, in the case when the incoming light is relatively coherent and quasi-monochromatic, the standard Fourier propagator may be employed (see, e.g., Goodman, J. W. *Introduction to Fourier Optics*, McGraw-Hill Science/Engineering/Math; 2d edition, Jan. 1, 1996).

The information captured by a single addressable imaging array, which is a function of the intensity of the incoming radiation, is insufficient to allow the application of the propagator to it. Additional, auxiliary data is required. For example, in the case of the Fourier propagator, both the amplitude and the phase of the radiation is required, whereas only the absolute value of the amplitude can be determined from the information at a single imaging array.

In the preferred embodiment, the method for determining the auxiliary data necessary to apply the propagator is illustrated in FIG. 13 and FIG. 14 *a-c* and described in the accompanying description of said figures. With the auxiliary data determined by this method, the propagator may be applied to the combined measured and auxiliary data to estimate the radiation distribution at an arbitrary imaging plane.

Figure 10:
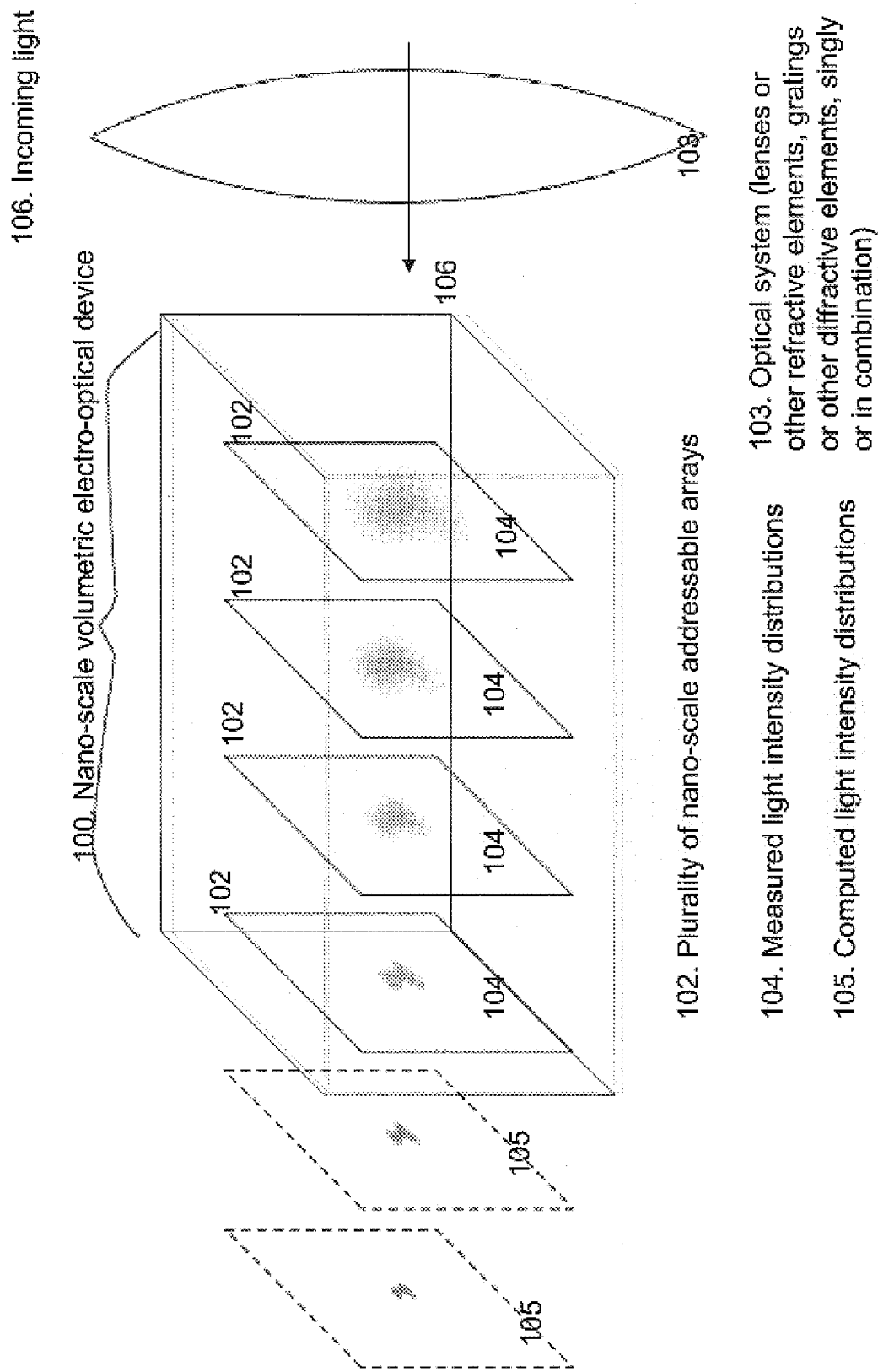
FIG. 10 depicts measurement of radiant energy intensity distribution by nanowire arrays.

FIG. 10 illustrates an application of the current invention in which incoming light 106 is modified by an optical system 103 in a nano-scale volumetric electro-optical device 100. Measured light intensity distributions 104 are measured by addressable arrays in the layers of the device, and computed light intensity distributions 105 are computed for one or more imaging planes for which the distribution was not measured. This enables correct focusing of an object whose ideal focal plane is, for example, beyond the region enclosed by the nano-scale volumetric electro-optical device 100.

Figure 11:
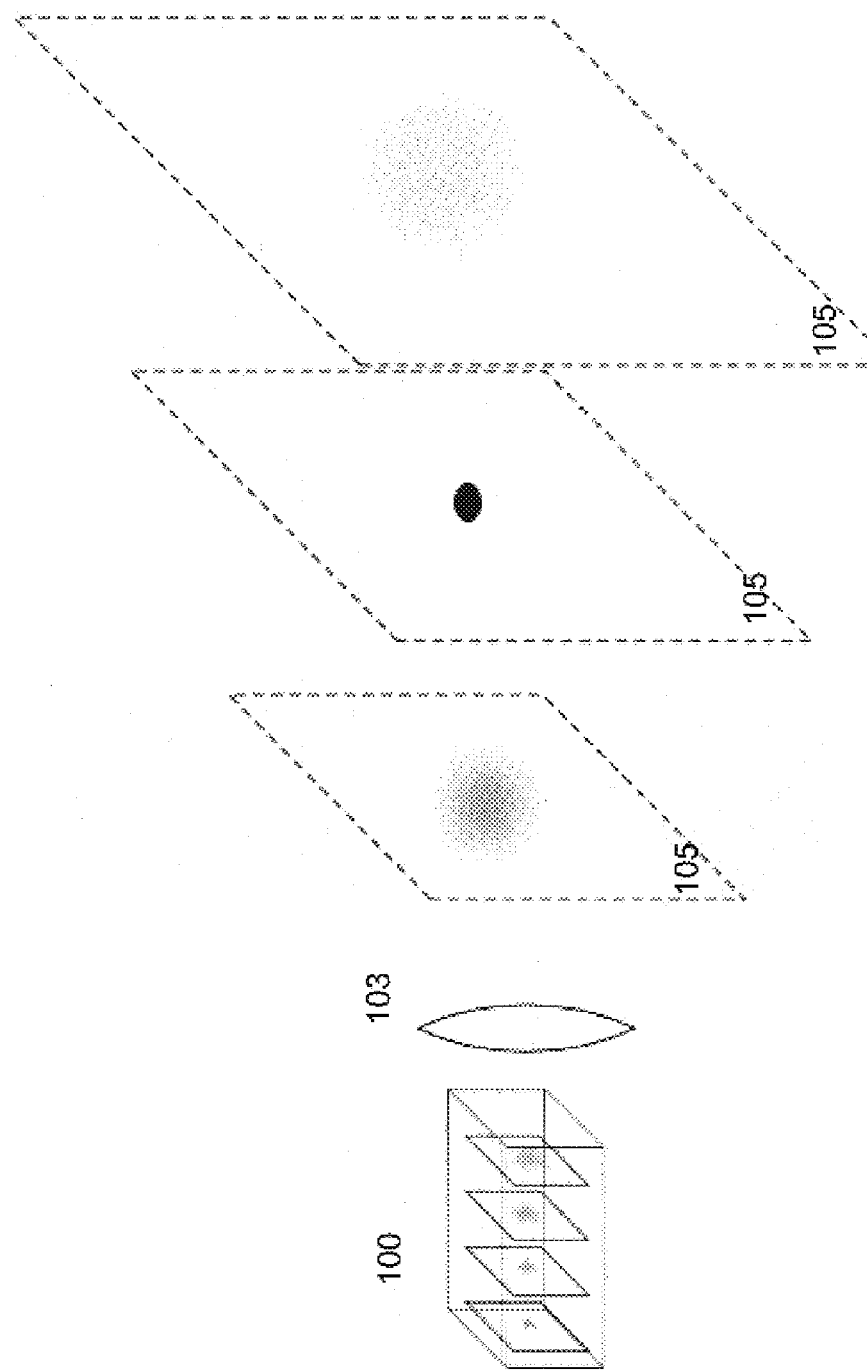
FIG. 11 illustrates computed radiant energy intensity distributions enabling positioning of radiant energy sources.

FIG. 11 illustrates an application of the current invention in which the imaging plane or planes corresponding to computed light intensity distributions 105 are positioned in the same region in which the light is emanating. This enables the spatial position of light emitting sources to be determined by locating those points in space toward which the backward propagated light appears to be converging. (For an exemplary discussion, see Xiong, Y. and Shafer, S. (1993) Depth from focusing and defocusing. Tech. Report CMU-RI-TR-93-07, Robotics Institute, Carnegie Mellon University, March, 1993).

FIG. 12 depicts an application of the invention in, for example, microscopy, in which an imaging device is brought into proximity to a volume of substantially transparent medium 107 (possibly a liquid volume) containing light-emitting particulate matter 108 and the light intensity distribution is measured at a multiplicity of nanoscale addressable arrays 102. Thus a small volume of liquid with fluorescently labeled or otherwise illuminated biological molecules or cells can be imaged. Several images can be recorded in sequence to provide dynamic view of motion of small particles in small volumes.

FIG. 13 further depicts an application wherein the imaging plane or planes for which the computed light intensity distributions 105 would lie within the transparent medium 107 or liquid volume enabling the shape and position of the light-emitting particulate matter to be determined.

One useful aspect of the invention is the ability to take data from the arrays and mathematically calculate what the image would look like at imaging plane where no measurements were taken. FIG. 14*a* is a schematic representation of a process of the current invention by which sufficient data auxiliary to the measured light intensity distribution is generated to enable the computation of the light intensity distribution at other, unmeasured, imaging planes. FIG. 14*a* illustrates the case where there are four distributions, $I_0$, $I_1$, $I_2$, and $I_3$ measured by four arrays. A propagator, $\Pi$, is chosen (selection rationales are elaborated in paragraphs that follow) and an initial estimate, $\Theta_{0,0}$, of auxiliary data necessary to apply the propagator is also chosen. One skilled in the relevant art appreciates that there are a multiplicity of reasonable choices for the initial auxiliary data, two choices commonly used include data whose values are uniform (e.g., constant in some sense) or randomly distributed. The propagator is used to compute what the intensity distribution and auxiliary data would be at a subsequent addressable array in another layer or on another plane. The computed intensity distribution is replaced by the measured distribution and the process is repeated until the final addressable array is reached. At that point, the propagator is replaced by its inverse and the process is repeated (in reverse) until again reaching the first addressable array, where again the computed intensity distribution is replaced by the measured one. The entire process is repeated until subsequent changes in the auxiliary data are minimal.

The propagator, Π, should be chosen to reflect particular characteristics of the application, most especially the type of light or radiation being captured. For example, in the case when the incoming light is relatively coherent and quasi-monochromatic, the standard Fourier propagator may be employed (see, e.g., Goodman, J. W. *Introduction to Fourier Optics*, McGraw-Hill Science/Engineering/Math; 2d edition, Jan. 1, 1996). In this case, the appropriate auxiliary data is the phase distribution of the light and the method illustrated is then a variant of the Gerchberg-Saxton and Yang-Gu algorithms (see, e.g., W. X. Cong, N. X. Chen, and B. Y. Gu, "Phase retrieval in the Fresnel transform system—a recursive algorithm," *J. Opt. Soc. Am. A* 16, 1827-1830, 1999).

In the preferred embodiment where the radiation employed is quite incoherent and/or broadband, one could select the classical Hamiltonian as propagator (see, e.g., J J Duistermaat—*Fourier integral operators* 1973—New York: Courant Institute of Mathematical Sciences, New York; V Guillemin, S Sternberg, *Geometric asymptotics*. Mathematical Surveys, No. 14. Amer. Math. Soc., Providence, R.I., 1977). In this case, the auxiliary data is the light intensity distribution on the direction (cotangent) bundle over the imaging plane under consideration.

Figure 14B:
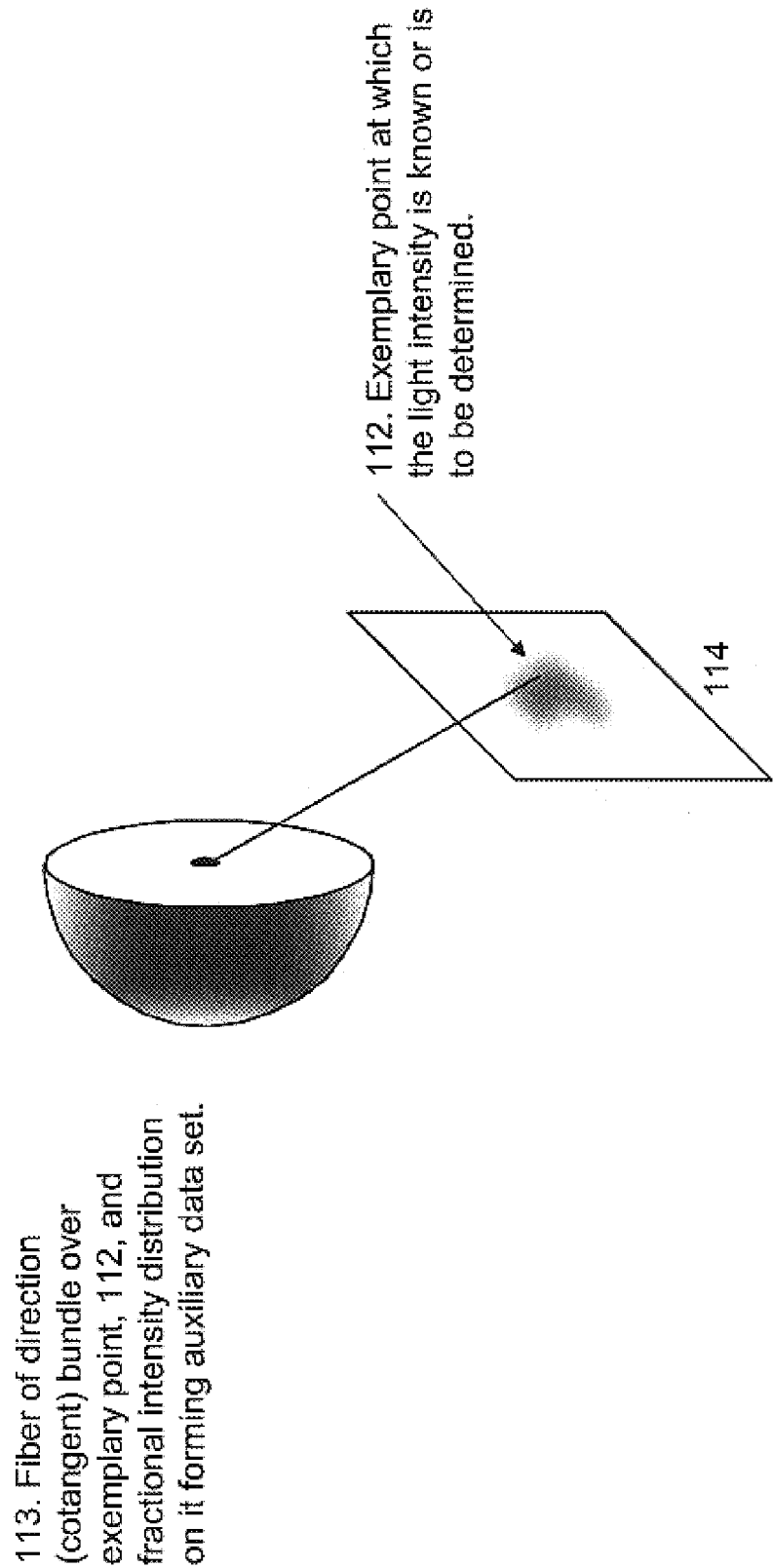
FIG. 14b illustrates auxiliary data in cases employing a Hamiltonian propagator.

FIG. 14*b* illustrates the interpretation of the required auxiliary data in the case of employing the Hamiltonian propagator. Over each point 112 in an imaging plane 114, what is needed to apply the Hamiltonian propagator is (a) the value of the intensity at that point and (b) the fractional distribution of the intensity among all the available directions from that point is needed (the so-called "fiber" of the direction bundle 113). In the example illustrated, it is assumed that all the directions to be considered are facing toward the left—opposite of the direction of the incoming light (depicted in FIG. 10). A constraint on this fractional distribution on the fiber is that the sum of distribution of intensities in all possible directions should add up to 1. In consequence, the intensity of the light in a particular direction is equal to the intensity value at the base point times the value of the fractional distribution in that direction.

Figure 14C:
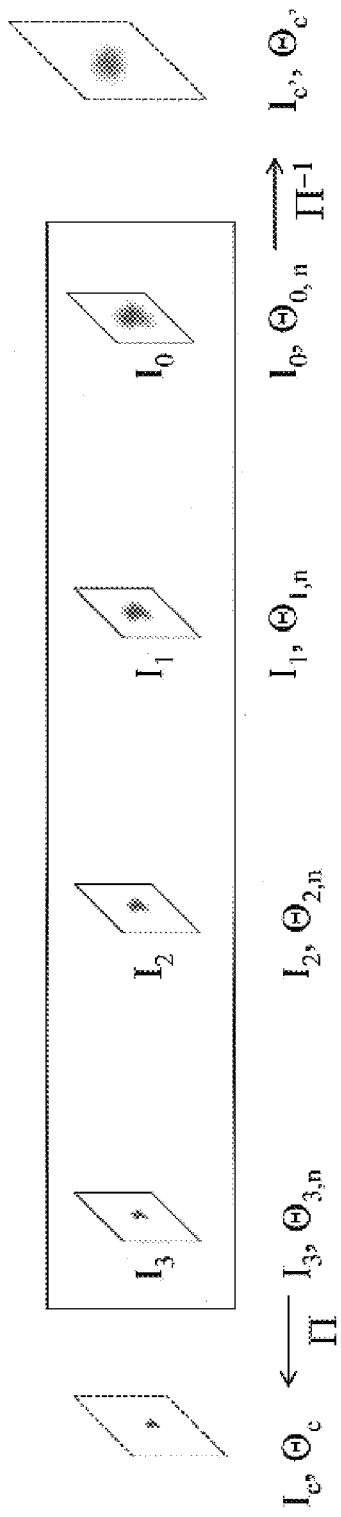
FIG. 14c illustrates a process for computing radiant energy intensity distributions for imaging planes where the distribution was not measured.

FIG. 14*c* illustrates the process by which, after having computed the auxiliary data, as described in the preceding paragraph, light intensity distributions may be computed for imaging planes where the distribution was not measured. The acronym NVED stands for "Nanoscale volumetric electro-optical device".

Figure 15:
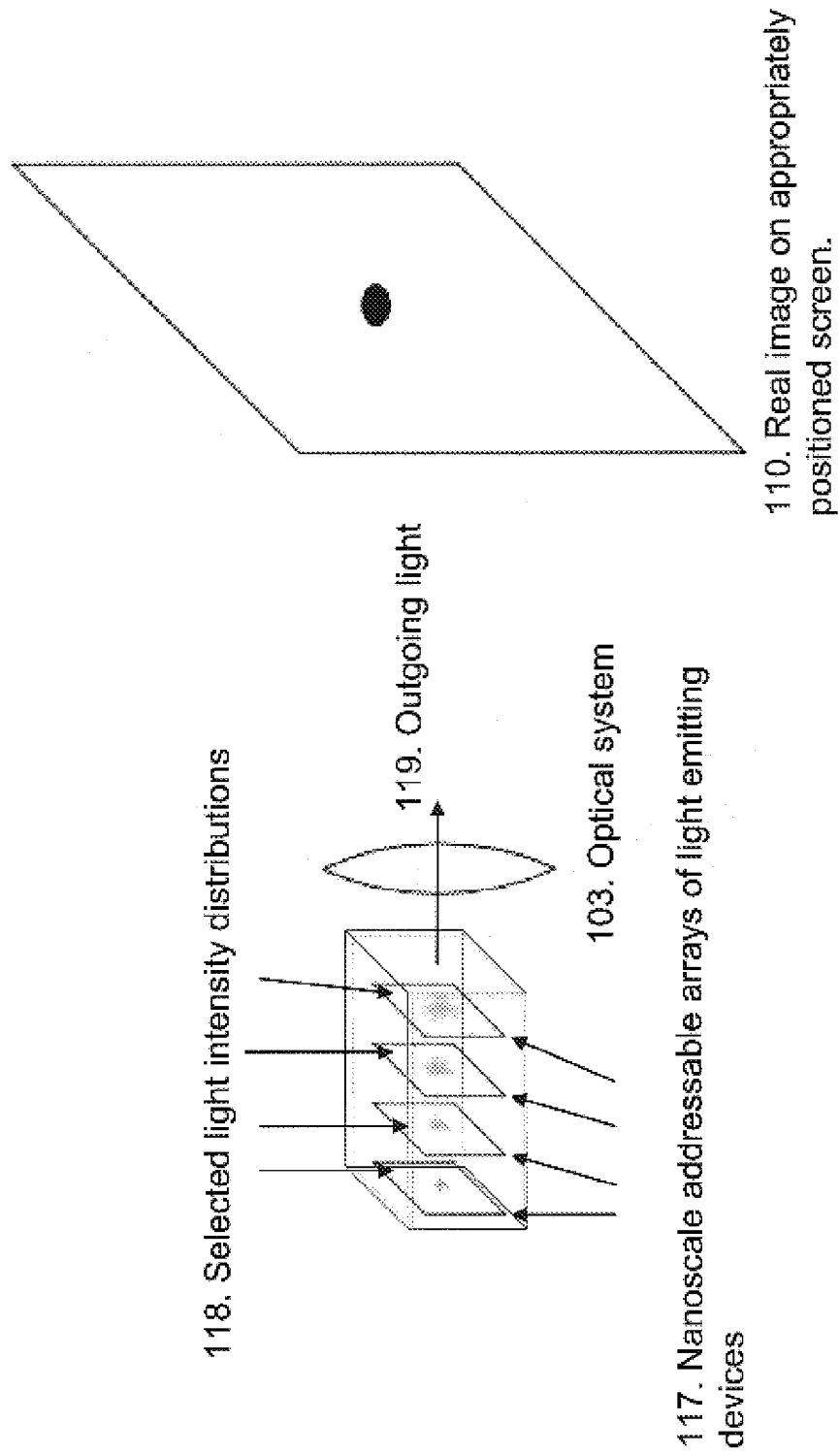
FIG. 15 depicts an embodiment in which array structures generate radiant energy and enable reconstruction of a previously recorded image.

FIG. 15 illustrates an embodiment of the current invention in which similarly structured addressable arrays are employed to generate light and so, in part, reconstruct a real image of a previously recorded scene, as follows from the above considerations. Addressable arrays of light emitting devices 117 in selected intensity distributions generate outgoing light 119 or other radiant energy which may pass through optical system 103 and produce a real image 110.

It will be apparent to one of skill in the art that the invention as described herein is applicable to the entire spectrum of electro magnetic radiation, including the range from very short to very long wavelengths. Other applications include, but are not limited to fluoroscopy, microscopy, astronomy, ultraviolet imaging, X ray, radio frequencies, to name a few. It is also the case that the invention may be applied to imaging applications such, for example, a nanoscale electro-optical "tweezer" (see U.S. Pat. No. 6,743,408). It is anticipated that this invention as applied to astronomy may enable, through diffractive optics, the overcoming of atmospheric anomalies. Large arrays may be applied to ultrasound. Moreover, the invention may also be useful with atomic scale detectors provided one can achieve radiation capture and remission on coincidence of incoming signals.

The present invention is not limited to given embodiments or examples. It is the attached set of claims that define possible further embodiments for a person skilled in the art.

The invention claimed is:

1. A method of making a nanoscale imaging device comprising the steps of:
   a) depositing a plurality of nanoscale devices on a preselected form of transmissive material;
   b) assembling an addressable array of said nanoscale devices on said transmissive material; and
   c) establishing electrical connectivity between said addressable array to a logic device.

2. A method as in claim 1 wherein the form of the transmissive material is that of a sheet and further including the step of assembling a plurality of sheets (stacking) to create a volume operable as a volumetric imaging device.

3. A method as in claim 1 further including the step of providing a means for gathering radiant energy.

4. A method as in claim 3 where such means provided includes a lens.

5. A method as in claim 3 further including the step of providing radiant energy emanation sources within the volume.

6. A method as in claim 2 wherein stacking is achieved through rolling a single sheet upon itself to form a multi layer volume.

7. A method as in claim 2 wherein stacking is achieved though folding a single sheet a number of times to create the desired number of layers.

8. A method as in claim 1 wherein the electrical connectivity between the addressable arrays and the logic device is achieved through capacitive conductance.

9. A method as in claim 1 further including the step of electrically connecting a plurality of arrays on the sheet.

10. A method as in claim 1 further including the step of connecting the logic device to a display device.

11. A method for assembling a nanoscale volumetric imaging device for imaging some radiation of interest, said method comprising the steps of:
   a) selecting transmissible material in a predetermined shape having two surfaces;
   b) depositing an addressable array of nanoscale devices on one surface of said transmissible material by the sub steps of:
      i) depositing a first layer of nanoscale devices;
      ii) depositing a second layer of nanoscale devices on top of the first layer of nanoscale devices such that the second layer shares points of intersection with the first layer; and
   c) coupling said addressable array to a logic device, said logic device operable to receive, process, store and transmit data created by exposing said addressable array to said radiation of interest.

12. An imaging device for imaging a radiation of interest comprising:
   at least one sheet of a selected material, said sheet transmissive to said radiation of interest;
   at least one addressable array, said array composed of one or more varieties of nanoscale devices where said array is supported by said sheet, and where said array being electrically coupled to at least one microscale device operable to transmit, upon exposure to said radiation of interest, corresponding array data to a data processing means so as to enable display of an image representing said exposure to said radiation of interest.

13. An imaging device as in claim 12 further including a radiant energy transform system that modifies incoming radiant energy such that the radiant energy intensity distribution is measured at a sufficient number of addressable arrays so that the radiant energy intensity distribution may be computed for one or more imaging planes for which the radiant energy intensity distribution was not measured.

14. An imaging device as in claim 13 wherein the imaging planes for which the radiant energy intensity is computed coincide with the imaging plane or planes from which the radiant energy is emanating.

15. An imaging device as in claim 14 wherein the radiant energy of interest emanates from matter within a transmissive medium volume, and wherein said imaging device detects such radiant energy source.

16. An imaging device as in claim 15 wherein the imaging planes for which the radiant energy intensity distribution are computed lie within the transmissive medium volume, enabling shape and position of said matter to be determined.

17. An imaging device as in claim 16 further including radiant energy generating addressable array elements operable to display a previously recorded image.

18. An imaging device as in claim 12 wherein the radiation of interest is visible light.

19. An imaging device as in claim 12 further including at least one radiation gathering element.

20. An imaging device as in claim 12 wherein the sheet is composed of at least one layer of BOPET polymer.

21. An imaging device as in claim 12 wherein the nanoscale devices are nanowires.

22. An imaging device as in claim 21 wherein the nanowires are approximately 3-50 nanometers in diameter and of a length of at least approximately 10-100 microns.

23. A imaging device as in claim 22 wherein the nanowires are selected from semiconductor materials of Gallium Arsenide, and Indium Phosphide.

24. An imaging device as in claim 23 wherein the nanowires have a core-shell structure.

25. An imaging device as in claim 24 wherein the core is Si and the shell is Ge outer.

26. An imaging device as in claim 25 wherein the core is $Cu_2S$ and the shell is CdS.

27. An imaging device as in claim 26 wherein the core is $Cu_2S$ and the shell is Au nanoparticles.

28. An imaging device as in claim 27 wherein the array is of a size of about approximately one thousand nanowires along each horizontal and vertical edges.

29. An imaging device as in claim 28 wherein the array includes smaller arrays that are electrically connected.

30. An imaging device as in claim 12 wherein the distance between the wires and the distance between the sheets is about equal.

31. An imaging device as in claim 12 wherein the sheet is stacked so as to have from 2 to approximately 2000 layers.

32. An imaging device as in claim 12 wherein said microscale device is microscale wires electrically coupled with the addressable array so as to convey data concerning the impingement of radiation on the array to a logic device.

33. An imaging device as in claim 32 wherein the addressable array is capacitively coupled to a logic device.

34. An imaging device as in claim 33 where said logic device is a CMOS chip.

35. An imaging device as in claim 34 wherein said data is processed and transmitted to a human viewable-display.

36. An imaging device as in claim 35 where said human viewable display is in wireless connection with said imaging device.

37. An imaging device as in claim 36 where said human viewable display is on a portable electronic device such as a camera phone.

38. An imaging device as in claim 37 wherein the images appear to be continuous to the human eye.

39. An imaging device as in claim 30 wherein the images are recorded.

* * * * *